United States Patent [19]
Preslar et al.

[11] Patent Number: 5,347,169
[45] Date of Patent: Sep. 13, 1994

[54] INDUCTIVE LOAD DUMP CIRCUIT

[76] Inventors: Donald R. Preslar, 264 Kingbird Ct., Three Bridges, N.J. 08887; Raymond L. Giordano, 219 Thatcher Hill Rd., Flemington, N.J. 08822

[21] Appl. No.: 941,736

[22] Filed: Sep. 8, 1992

[51] Int. Cl.[5] ............... H01H 47/00; H03K 17/08
[52] U.S. Cl. .................... 307/246; 307/571; 361/159
[58] Field of Search ............... 307/491, 571, 572, 584, 307/246; 361/152, 154, 159

[56] References Cited
U.S. PATENT DOCUMENTS

| | | | |
|---|---|---|---|
| 4,581,540 | 4/1986 | Guajardo | 307/584 X |
| 4,728,826 | 3/1988 | Einzinger et al. | 307/571 |
| 4,774,624 | 9/1988 | Qualich | 361/159 |
| 4,952,827 | 8/1990 | Leipold et al. | 307/571 |
| 5,028,811 | 7/1991 | Le Roux et al. | 307/571 X |

Primary Examiner—Willis R. Wolfe

[57] ABSTRACT

A circuit in which the source-to-drain conduction path of a power switching transistor is connected in series with an inductive load between first and second power terminals includes a voltage transient clamping transistor having its source-to-drain conduction path connected between the drain and gate of the switching transistor. In response to a turn-off signal applied to the gate of the switching transistor, a transient voltage is generated at the drain of the switching transistor. When the transient voltage at the drain of the power switching transistor exceeds a predetermined value, the clamping transistor is turned-on. The conduction of the clamping transistor limits the voltage rise at the drain of the switching transistor and tends to maintain the switching transistor conducting temporarily to aid in the discharge of the energy stored in the inductive load. A unidirectional conducting element connected in series with the clamping transistor ensures that only current of a polarity to discharge the inductive load flows through the clamping transistor.

23 Claims, 6 Drawing Sheets

INDUCTIVE LOAD DUMP CIRCUIT

BACKGROUND OF THE INVENTION

This invention relates to circuitry for protecting a transistor against excessive transient voltages developed across the transistor such as when the transistor drives an inductor.

Figure 1:
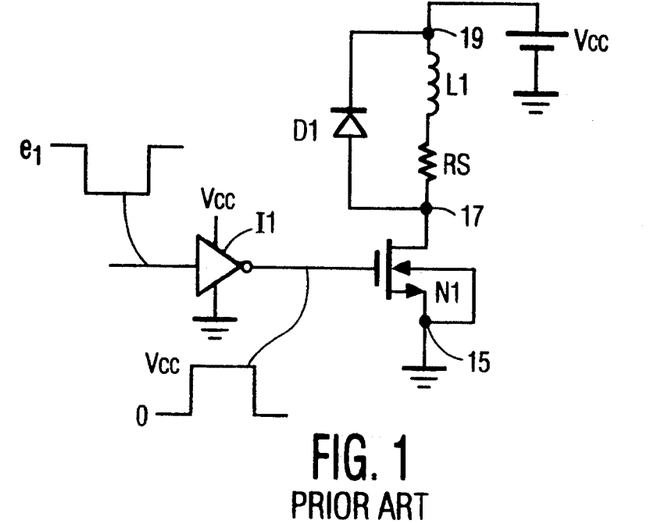
FIG. 1 is a schematic diagram of a prior art circuit using a shunting diode for limiting an inductive kick.

It is known to use an insulated-gate field effect transistor (IGFET) power transistor to drive an inductive load. As shown in FIG. 1, a metal-oxide-semiconductor (MOS) power switching transistor N1 has its conduction path connected between ground terminal 15 and a node 17. An inductor L1 connected in series with a resistance Rs is connected between node 17 and a power terminal 19 to which is applied a source of operating potential of VCC volts. The resistor Rs shown connected in series with inductor L1 may be a discrete current limiting resistor, or the inherent resistance of the inductor, or may represent a combination of both. When the transistor N1 is turned-on the current through the inductor increases with time, and when N1 is on for a period of time which exceeds the inductive-resistance time constant (T=L1/Rs), the current through the inductor L1 approaches a value of IMAX=VCC/Rs. When transistor N1 is turned-off, after being turned-on for any significant period, the electromotive force of the inductor attempts to maintain the current flow by generating a voltage which results in what is known in the art and referred to herein as an "inductive kick". The value of the voltage generated across the inductor is equal to Ldi/dt and has a polarity to raise node 17 above the positive power supply, where L is the inductance of the inductor (coil) and di/dt is the time rate of change of the decay current. The amplitude of the inductive kick voltage may range up to several hundred, and even thousands of volts. This high voltage kick at node 17 may exceed the breakdown voltage (BVDS) of the transistor N1 causing the transistor to be damaged and/or destroyed and also causing damage to associated circuitry. Therefore, the voltage at the drain of N1 must be limited to avoid exceeding the break down voltage of N1 and the generation of high amplitude transient voltages.

A known method for limiting the voltage due to an "inductive kick" includes the use of a "load dumping" diode such as diode D1 connected at its anode to node 17 and at its cathode to terminal 19. So connected, the voltage at node 17 can rise to one forward diode drop (VF) above VCC. The diode D1 functions to limit the voltage kick at node 17 to VF+VCC and the voltage across the inductor-resistor combination is limited to VF volts (typically 0.8 volts). Limiting the voltage across the inductor-resistor to such a relatively small value (i.e., VF volts) effectively limits the inductive kick, but as a result it takes a relatively long time to discharge the energy stored in the inductor. The ideal discharge (or decay) time (TD) of an inductor with zero resistance is equal to L(IND)/VL; where L is the inductance of the coil, IND is the current in the inductor at the time N1 is turned-off, and VL is the voltage drop across the inductor. Thus the discharge time is inversely proportional to the voltage across the inductor. Also, the diode must be made very large to handle the maximum inductive current which may equal VCC/Rs.

Figure 2:
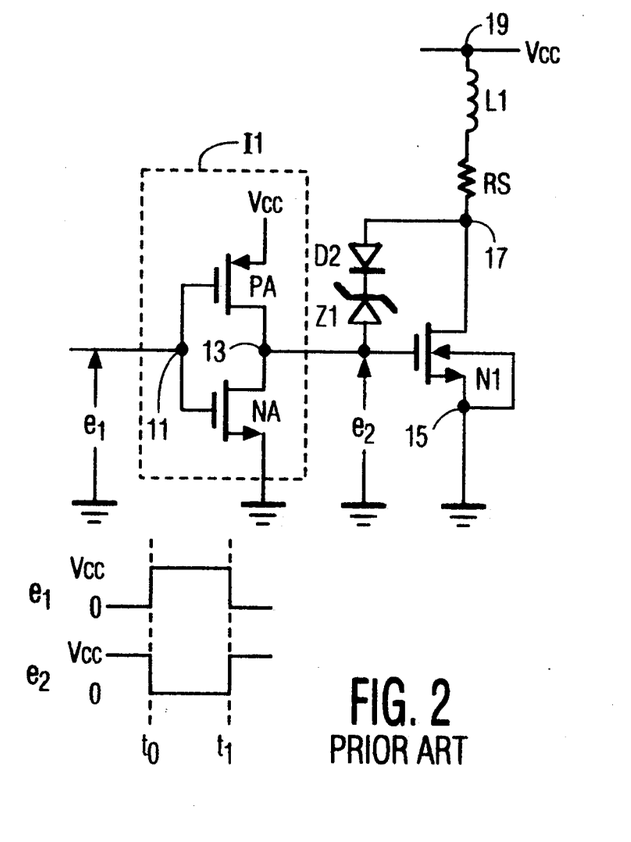
FIG. 2 is a schematic diagram of a prior art circuit for limiting an inductive kick using a Zener diode in a feedback configuration.

To avoid the problems present when using a single diode, it is known to use a Zener diode (Z1) and a diode (D2) serially connected between the drain and gate of power transistor N1 as shown in FIG. 2. Referring to FIG. 2, it should be noted that, as in the circuit of FIG. 1, after N1 is turned-on for some time a substantial current flows through L1 and via the conduction path of N1 to ground. Typically N1 will be turned-off by the turn-on of transistor NA in inverter I1 which tends to clamp the gate of N1 to ground. When N1 is turned-off at a time t1, the voltage at node 17 tends to rise sharply. When the voltage (V17) at node 17 rises above the forward drop (VFD2) of D2 and the Zener voltage (VZ) of Z1, conduction takes place from node 17 via D2 and Z1 into the gate of N1. As a result, V17 will be held at a value equal to the VFD2 of D2 plus the VZ of Z1 above the voltage (V13) at the output 13 of inverter I1. Typically, V13 will be maintained a little above the threshold voltage (VTH) of N1, which is within a volt or so of ground potential. Thus by selecting VZ+VFD2+VTH to be less than the breakdown voltage of N1, the voltage at node 17 is prevented from exceeding the breakdown of N1.

Limiting or clamping the voltage at node 17 using Zener diode feedback as shown in FIG. 2 is advantageous in that the Zener diode voltage can be selected to control V17 to be less than the drain-to-source and drain-to-gate breakdown voltage of N1. Furthermore, it provides a larger amplitude turn-off voltage across the inductor which results in the current in the inductor being discharged much faster. Furthermore, most of the inductive load dump current flows through power transistor N1, whereby the Zener diode can be made to be a low current structure.

However, a problem exists in that it is not always possible to make a zener diode with the required zener breakdown voltage and/or needed characteristics. Moreover, in some processes it is not even possible to make a zener diode within the same structure as the MOS power transistor.

To overcome this problem, an object of the present invention is to use a "clamping" transistor to clamp any transient voltage produced at the drain of the power switching transistor instead of a zener or diode clamp.

SUMMARY OF THE INVENTION

In circuits embodying the invention, a normally non-conducting clamping transistor is connected between the drain (output) and the gate (input) of a power transistor having an inductive load connected in its drain circuit. The clamping transistor does not conduct until the power transistor is turned off and an "inductive kick" transient voltage is produced at the drain of the power transistor which exceeds a predetermined control voltage applied to the gate of the clamping transistor. The value of the control voltage is selected to ensure that the clamping transistor turns on when the voltage excursion at the drain of the power transistor is below its breakdown voltage. Therefore, in "transistorized" designs embodying the invention, potentially high transient voltages are not generated when conduction through an inductor is interrupted.

A significant aspect of the invention is that the turn-off of the power transistor is initiated by the application of a turn-off signal to the gate of the power transistor by means of a signal source whose impedance is not negligible. Consequently, when the clamping transistor is turned on it functions to discharge the inductive load via its conduction path and the signal source impedance. Due to the presence of the signal source impedance, the clamping transistor, when turned-on, provides a negative feedback path between the drain and gate of the power transistor maintaining it on (or, turning it back on) temporarily, whereby the conduction path of the power transistor functions as an additional discharge path for the energy stored in the inductive load.

A still further aspect of the invention is the formation of the clamping transistor and the power transistor on the same substrate. Where, for example, the clamping transistor is an insulated-gate field-effect transistor (IGFET) having source and drain electrodes defining the ends of a conduction path a problem exists in that the source and/or drain regions of the clamping transistor may become forward biased causing undesirable and potentially dangerous currents to flow in the substrate resulting in a latch up condition and/or other uncontrolled condition. In circuits embodying the invention, clamping transistors are biased and arranged to avoid and/or eliminate the flow of substrate currents.

BRIEF DESCRIPTION OF THE DRAWING

In the accompanying figures like reference characteristics denote like components.

DETAILED DESCRIPTION OF THE INVENTION

Insulated-gate field-effect transistors (IGFETs) are the active devices preferred for use in practicing the invention. For this reason, the circuits are illustrated in the drawing as employing such transistors and will be so described hereinafter. However, this is not intended to preclude the use of other suitable devices and to this end, the term "transistor" when used without limitation in the appended claims, is used in a generic sense.

In the figures, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definition and characteristics of IGFETs pertinent to the invention are set forth below.

1. IGFETs have a first electrode and a second electrode referred to as the source and drain defining the ends of a conduction path, and a control electrode (gate) whose applied potential determines the conductivity of the conduction path. For a P-type IGFET the source electrode is defined as that electrode of the first and second electrodes having the highest potential applied thereto. For an N-type IGFET, the source electrode is defined as that electrode of the first and second electrodes having the lowest potential applied thereto.

2. The IGFETs used are bidirectional in the sense that when an enabling signal is applied to the control electrode, current can flow in either direction in the conduction path defined by the first and second electrodes.

3. For conduction to occur, the applied gate-to-source potential (Vgs) must be in a direction to turn-on the transistor and must be greater in magnitude than a given value which is defined as the threshold voltage (VT). Thus, where the applied Vgs is in a direction to turned-on the transistor but is lower in amplitude than VT the transistor remains cut off and there is substantially no current flow in the conduction channel.

4. When used as a source follower, the voltage at the source electrode (Vs) "follows" the signal applied at the gate (Vg) but is offset with respect to the gate by a voltage whose amplitude is equal to the threshold voltage (VT) of the device ($vs = Vg - VT$).

5. In the drawings, P-type IGFETs are sometimes identified by an arrow on the source leg pointing towards the body of the IGFET and/or by an arrow on the substrate pointing away from the body. N-type IGFETs are sometimes identified by an arrow on the source leg pointing away from the body of the IGFET and/or by an arrow on the substrate pointing towards the body of the IGFET.

Figure 3:
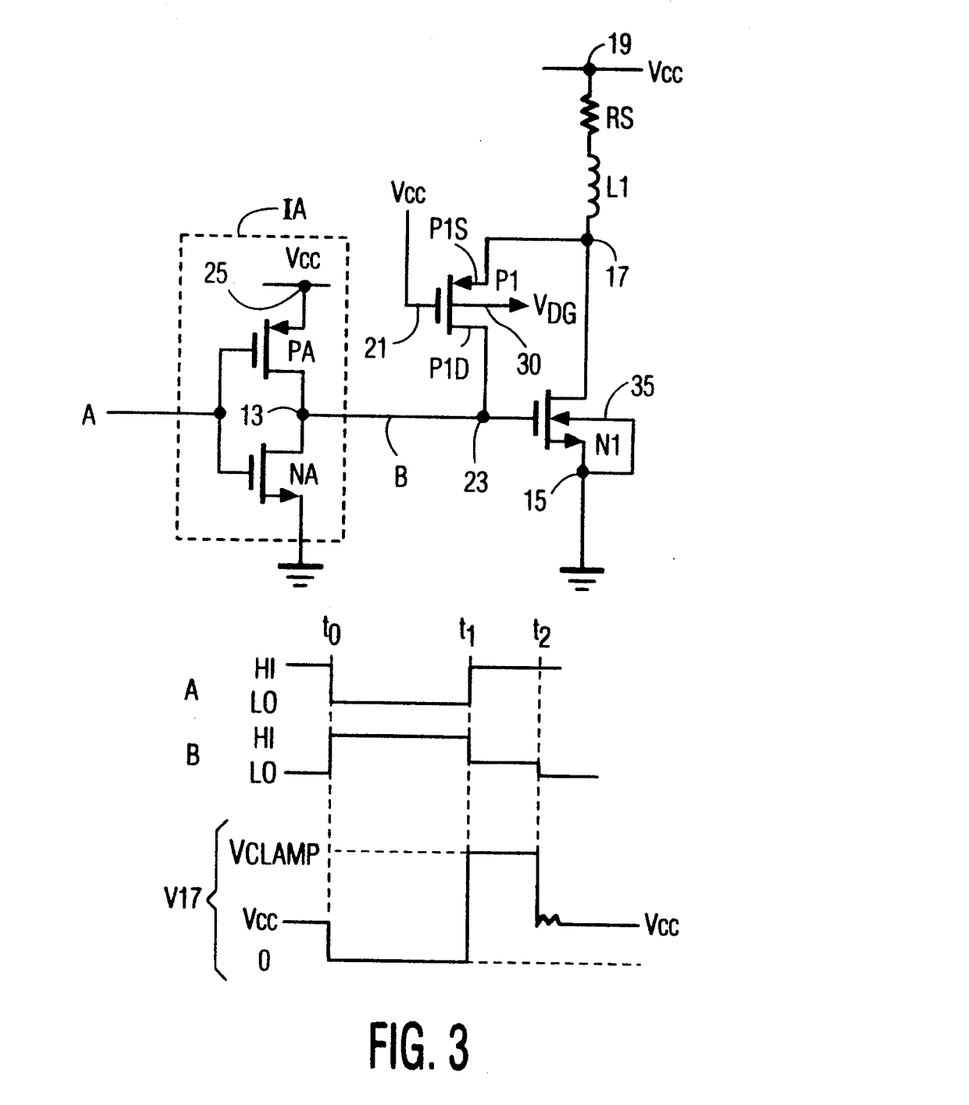
FIG. 3 is a schematic diagram of a circuit embodying the invention using a transistor in a feedback configuration to limit an inductive kick.

Referring to the circuit of FIG. 3, there is shown a power switching transistor N1 having its conduction path connected between ground terminal 15 and a node 17. An inductor L1 is connected in series with a resistor Rs between node 17 and power terminal 19 to which is applied an operating potential of Vcc volts. As before, Rs may be the inherent resistance of inductor L1, or a current limiting resistance in series with L1, or may represent a combination of both. Transistor N1 is an N-channel insulated-gate field-effect transistor (IGFET) and specifically is of the type known as a metal-oxide-semiconductor (MOS). N1 (as well as the other IGFETs used in the circuit) has source and drain electrodes defining the ends of its conduction path and a control electrode (gate) whose applied potential controls the conductivity of the conduction path. The substrate 35 of N1 is grounded and is shown connected to the source of N1. N1 functions as a power switching transistor and is designed to safely carry a maximum current equal to Vcc/Rs.

A P-channel IGFET P1 is connected at its source (P1S) to node 17, at its gate to a terminal 21 to which is applied Vcc volts, and at its drain (P1D) to the gate of N1 at a node 23. Node 23 is connected to the output of an inverter IA which includes an N-channel IGFET NA having its conduction path connected between node 23 and ground and a P-channel IGFET, PA, having its conduction channel connected between node 23 and a terminal to which is applied Vcc volts. Inverter IA is a conventional complementary MOS (CMOS) inverter. As shown for waveforms A and B of FIG. 3 when the signal A applied to the input of the inverter is "high" the signal B at its output is "low" (i.e., transistor NA is turned-on) and when A is "low" B is "high" (i.e., transistor PA is turned-on). When B is high, the Vcc voltage is applied via PA to the gate of N1. N1 is turned-on hard when PA is turned-on and NA is turned-off. Conventional current then flows from terminal 19 through the inductor L1 and the drain-to-source conduction path of N1 to ground. The current through L1 increases asymptotically reaching a maximum value approximately equal to Vcc/Rs. The turn-off of N1 is initiated when NA is turned-on and PA is turned-off, corresponding to time t1 in waveforms A and B of FIG. 3. NA tends to clamp the gate of N1 below the threshold voltage (VTH) of N1. However, whenever there is an attempt to turn-off N1 after it has been turned-on for some time and with some current flowing through L1, the energy stored in the inductor will generate a positive going overshoot (an "inductive kick") at node 17 as shown for waveform V17 of FIG. 3 from time t1 to t2. This overshoot is fed back via P1 to the gate of N1 and will maintain conduction through N1 until L1 is substantially discharged, as discussed below.

Whenever the voltage at node 17 rises to a value which exceeds the threshold voltage (VT) of P1 plus the voltage Vcc at the gate of P1, P1 turns-on and conducts substantial current into node 23 and via the conduction path of NA to ground. The turn-on of P1 clamps the voltage rise at node 17 to a value identified as VCLAMP in waveform V17 of FIG. 3. Although P1 is turned-on and conducts a current which tends to discharge the energy stored in inductor L1, the voltage at node 17 tends to remain at the VCLAMP level for a period extending from time t1 to t2, as shown in waveform V17 of FIG. 3. When P1 conducts sufficient current, it causes the voltage developed at node 23 to equal or exceed the threshold voltage of N1. This causes N1 to be maintained conductive, temporarily, and to conduct to ground via its conduction path some of the current flowing in L1 thereby discharging the energy stored in L1. As P1 and N1 conduct, the energy stored in L1 is being discharged until conduction through P1 decreases and NA brings the gate voltage (at time t2 of waveform B in FIG. 3) of N1 to ground. The voltage at V17 is then restored to Vcc volts as illustrated at time t2 for waveform V17 in FIG. 3.

Note that in circuits embodying the invention the source-to-drain conduction path of the transistor NA used to turn-off transistor N1 is designed to have sufficient impedance whereby when P1 is turned on and the current developed from the inductive kick flows through P1 and NA, the voltage across the drain-to-source of NA assumes a value which may exceed the threshold voltage of N1. This ensures that N1 is held-on during the discharge of the inductor and provides a controlled conduction path to discharge much of the current stored in L1 from time t1 to t2.

To ensure that the voltage feedback to the gate of N1 is sufficient to hold-it-on, P1 may be designed such that (when it conducts) its drain current is greater than the drain current of NA for their respective gate bias conditions. Viewed another way, the source-to-drain equivalent impedance of P1 is less than the source-to-drain equivalent impedance of NA.

It should be appreciated that P1, when conducting, functions to provide negative feedback between the drain and gate of N1 and ensures that the turn-off of N1 and the discharge of the energy stored in L1 occurs in a controlled, continuous, manner.

It should also be appreciated that the turn-on of P1 occurs when the potential at node 17 exceeds the gate voltage applied to P1 plus the threshold voltage (VT) of P1. In FIG. 3, the voltage applied to the gate of P1 is Vcc volts. However, it should be understood that the gate voltage applied to P1 can be selected to have many other values. For example, the gate of P1 can be connected to other voltages, higher or lower than Vcc. Furthermore, if a suitable voltage is not readily available, a control voltage dan be generated by any one of a number of known circuits and applied to the gate of P1. Thus, in contrast to zener diodes, the use of a feedback clamping transistor, such as P1, is useable with a wide range of different control voltages.

In FIG. 3, the substrate 30 of P1 is shown connected to a voltage VDG, where VDG is greater than Vcc+VTP. It is necessary to bias the substrate of P1 at VDG to ensure that the substrate-to-source and substrate-to-drain diodes of P1 remains reverse biased such as when P1 is subjected to a positive going voltage transient at node 17. This may be better understood by reference to FIG. 4.

Figure 4:
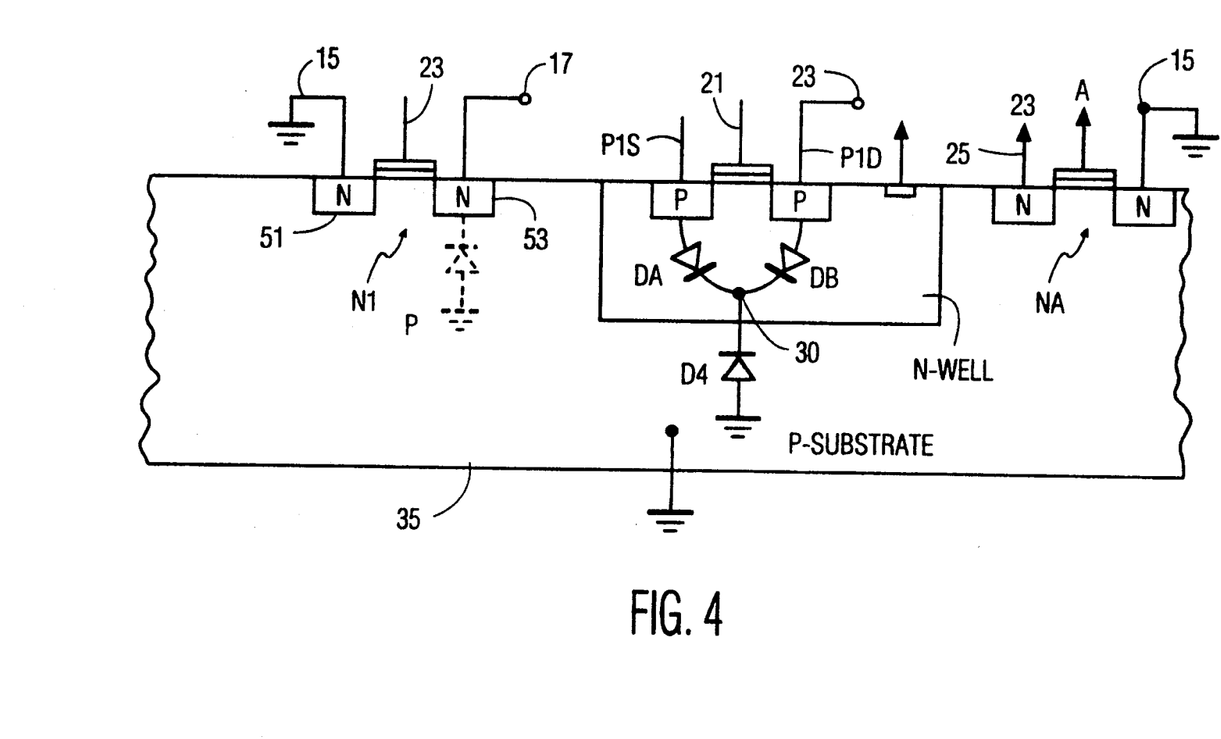
FIG. 4 is a cross section diagram of part of an integrated circuit embodying the invention.

Referring to FIG. 4 there is shown a cross-section of a complementary MOS implementation of the invention which highlights the interrelationship between N1, P1, and NA. Transistors N1 and NA are formed in a P-substrate 35 and transistor P1 is formed in an N-well 30 which is also formed within P-substrate 35. Of particular interest is the presence of diodes DA and DB which represent, respectively, the drain-to-N-well and source-to-N-well diodes associated with P1 and present in this implementation. Diode D4 represents the diode formed between N-well 30 and P-substrate 35.

It is evident from an examination of FIG. 4 that, if the voltage at the source region (P1S) or at the drain region (P1D) exceeds the voltage of the N-well 30, currents will flow via DA or DB into N-well 30 and then into substrate 35 and other regions sharing substrate 35 to cause significant problems such as CMOS latch up. Therefore, it is necessary that (as shown in FIG. 3) a bias (e.g., VDG) be applied to N-well 30 (the substrate of P1) to reverse bias the DA and DB diodes and inhibit the flow of parasitic currents via diodes DA or DB. Hence, to inhibit substrate bias currents, the substrate of P1 should be connected to the highest available potential.

Nevertheless, a problem exists resulting in the flow of a "fault current" where the inverter IA is operated at a higher supply voltage than the load driven by N1. This is best explained with reference to FIG. 5A, where VDD apppplied to power terminal 25 of inverter IA is 6 volts and VCC applied to power terminal 19 is 2.85 volts. The problem exists even when the substrate of P1 is connected to the highest potential of VDD volts. The problem also exists where VDD is equal to VCC volts since the turn on of PA may cause a fault current to flow through P1 as demonstrated by the following analysis. When PA is turned on (NA is turned-off), VDD is applied via the conduction path of PA to node 23 to which is connected the gate of N1 and electrode 81 of P1. This causes N1 to be turned-on hard and its drain (node 17) to be at or close to zero volts. Consequently, electrode 81 of P1 is at 6 volts and electrode 83 of P1 is at zero volts and the gate of P1 is at 2.85 volts. Electrode 81 then functions as the source of P1 and electrode 83 functions as the drain of P1. Where the threshold voltage of P1 is about 1 volt, P1 is turned-on and conducts a fault current into the drain of N1. For the bias condition just described, P1 is a turned-on transistor and conducts a current like any MOS transistor would when biased into conduction. However, as noted, this current is undesired and is therefore termed a fault current. This problem is resolved in circuits embodying the invention by the inclusion of a unidirectional conducting element in series with the clamping transistor P1.

Figure 5A:
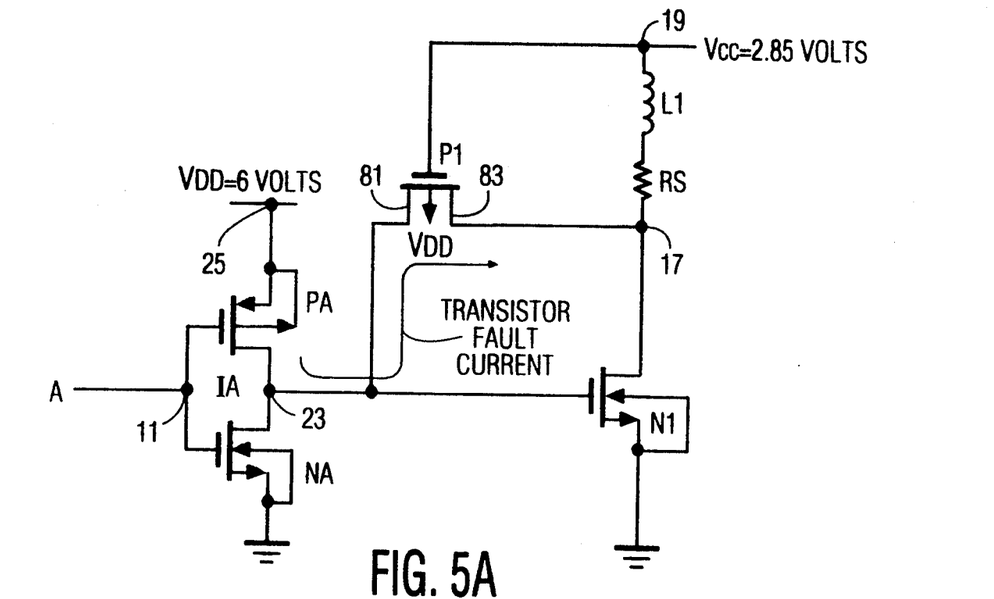
FIGS. 5A and 5B are schematic diagrams of circuits embodying the invention illustrating two different types of fault current paths.
Figure 5B:
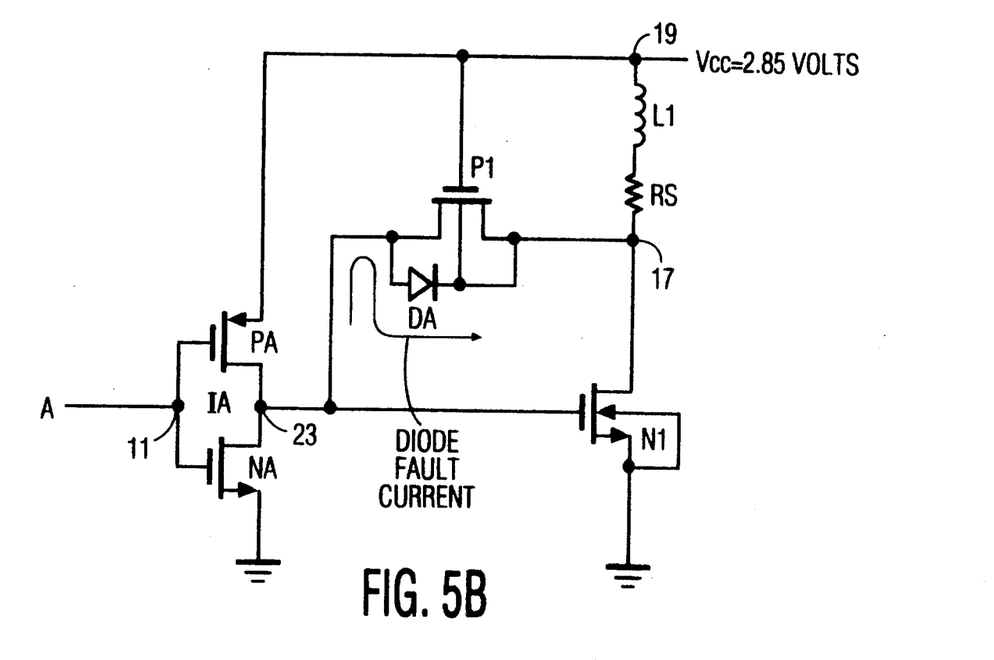

FIG. 5B illustrates the existence of a fault current path through the drain-to-substrate diode DA of P1 even when the inverter IA and the loads are operated at VCC volts and the gate voltage of P1 is at VCC volts. Note that when PA is turned-on and a "high" of VCC volts is applied to node 23, diode DA is forward biased and a fault current flows from node 23 via DA into the substrate region which is connected to node 17 which is low (the N1-on state). As for the circuit in FIG. 5A the drain or source to substrate diode fault current path is eliminated by the inclusion of a unidirectional conducting element.

Figure 6:
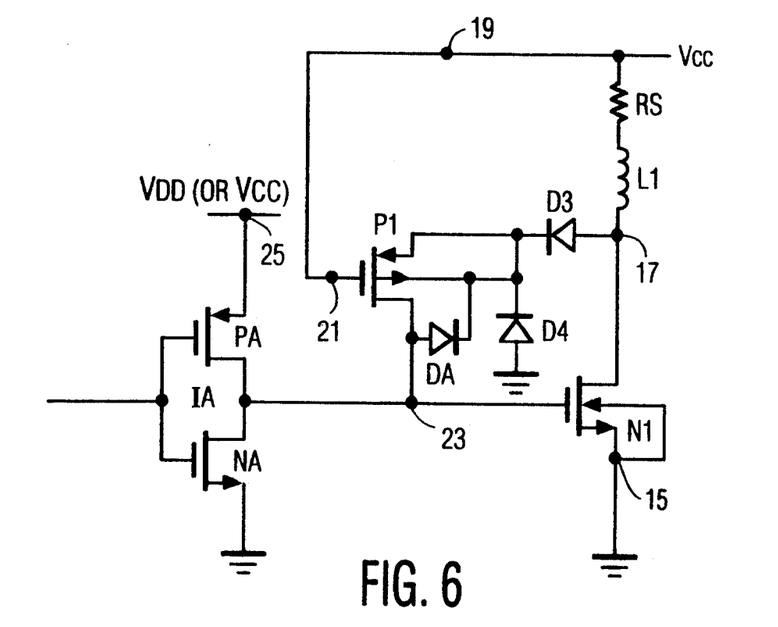
FIGS. 6, 7, 8 and 9 are schematic diagrams of circuits embodying the invention in which the fault current paths of FIGS. 5A and 5B are eliminated.

In the circuit of FIG. 6 the two different fault current paths discussed in FIGS. 5A and 5B are eliminated by a diode D3 connected in series with the conduction path of transistor P1. Referring to FIG. 6, there is shown a diode D3 connected between node 17 and the source of P1, with D3 being poled to conduct current from node 17 into the source of P1. Diode D3 blocks any current flow from node 23 which flows via the conduction path of P1. Like wise, diode D3 blocks the flow of current from node 23 via drain to substrate diode DA into node 17. The blockage due to D3 allows the substrate of P1 to be directly connected to, and biased by, the source of P1. Diode D4, shown connected between substrate 30 and ground (and as also shown in FIG. 4) represents the N-well to P-substrate diode in an N-well CMOS implementation of this invention and diode DA represents the drain to N-well diode in that implementation. Diode D3 blocks a fault current path through DA or through the conduction path of P1.

In FIG. 6, P1 turns-on when the voltage (V17) at node 17 exceeds the voltage at the gate of P1 by the VT of P1 and the forward drop of D3. The additional voltage drop due to D3 does not significantly alter the voltage level to which, and at which, node 17 is clamped by P1. However, if it is desired to lower (or raise) the clamping level of node 17, this can be done by altering the voltage applied to the gate of P1, as discussed above.

Figure 7:
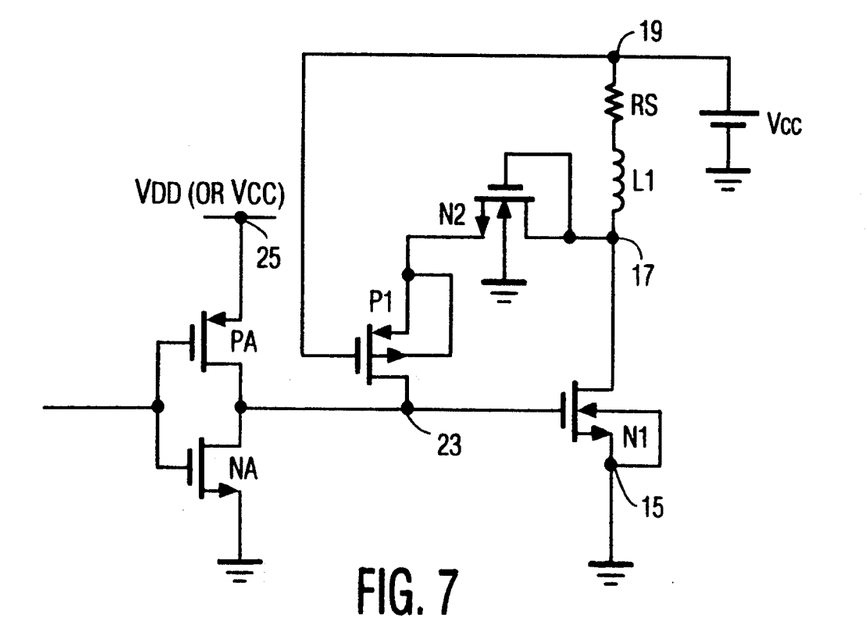

Diode D3 may be an MOS transistor connected to function like a diode. This is shown in FIG. 7 where an N-channel IGFET N2 has its gate and drain (anode) connected in common to node 17 and its source (cathode) connected to the source of P1 whose drain is connected to the gate of N1 at node 23. The substrate of N2 is connected to ground while the substrate of P1 and its source are connected in common. So connected, N2 blocks the flow of current from node 23 via the conduction path of P1 into node 17 while being poled to conduct current from node 17 via P1 into node 23. Thus the circuit of FIG. 7 provides clamping action while not being subject to latch up and to the flow of uncontrolled substrate currents. In FIG. 7, diode transistor N2 is connected between node 17 and the source of P1. This is similar to the placement of diode D3 which is shown connected between node 17 and the source of P1 in FIG. 6. However, diode D3 and N2 could instead be connected between the drain of P1 and node 23 as shown for diode connected transistor N3 in FIG. 8.

Figure 8:
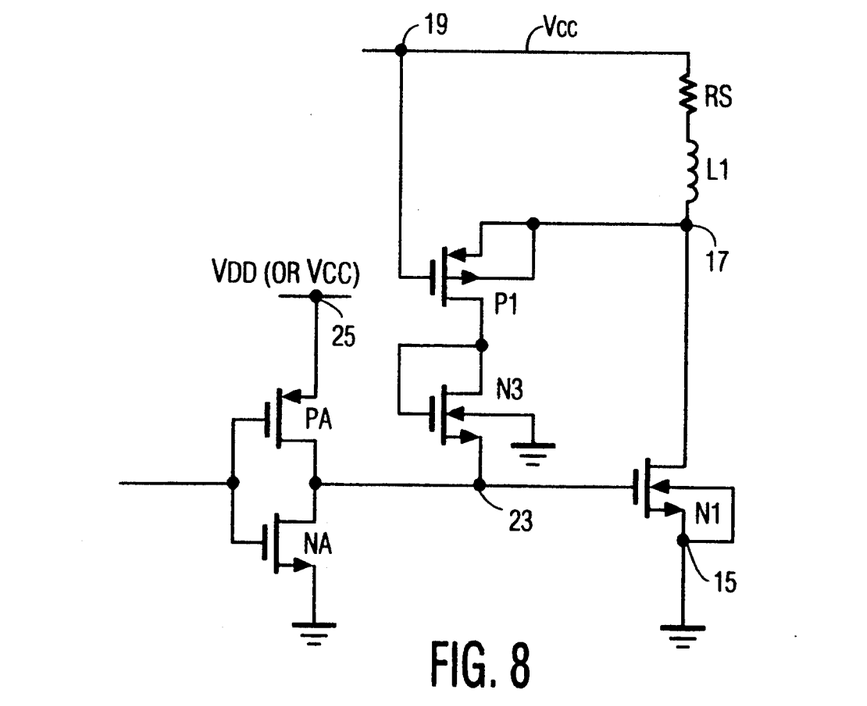

In FIG. 8, the substrate and source of P1 are connected to node 17, while the drain of P1 is connected to the gate and drain of N3. The source of N3 is connected to the gate of N1 at node 23 while the substrate of N3 is grounded. Transistor N3 is connected to function like a diode and functions to block the flow of conventional current which would flow from terminal 25 via PA and from terminal 23 into node 17.

Figure 9:
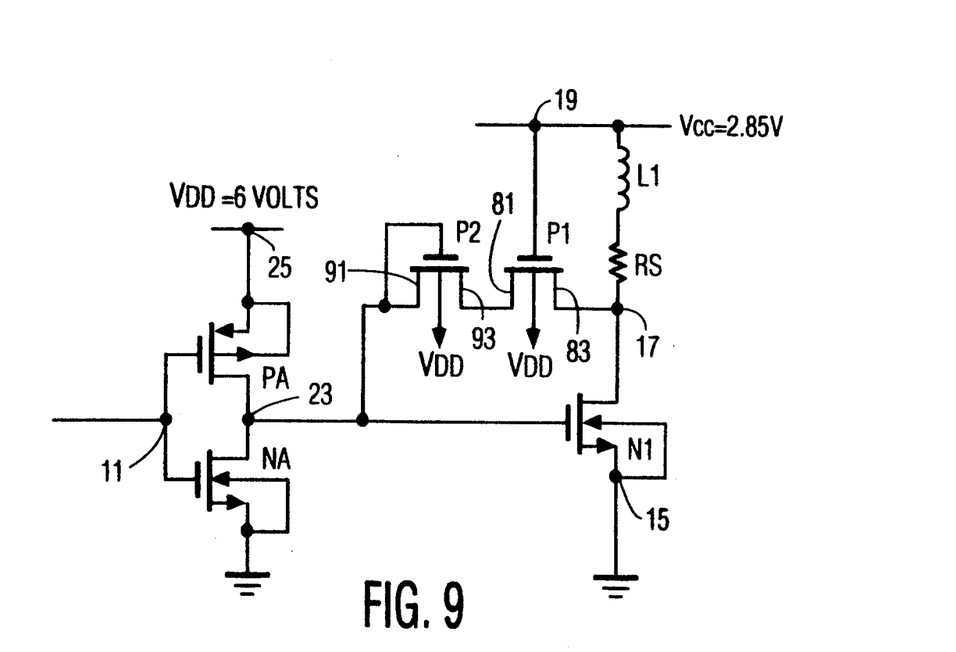

In FIG. 9, the fault path is eliminated by use of a transistor P2 connected like a diode in series with the conduction path of P1. In FIG. 9, the source and substrate of PA are connected to terminal 25 to which is applied VDD and its drain and the drain of NA are connected to node 23. The source and substrate of NA are connected to ground and the gates of NA and PA are connected in common to input terminal 11. Electrode 91 of P2 and its gate are connected to node 23 while electrode 93 of P2 is connected to electrode 81 of P1. The gate of P1 is connected to terminal 19 to which is applied VCC while the drain of P1 is connected to the drain of N1 at node 17. As before, the gate of N1 is connected to node 23, its source and substrate are grounded, and an inductive load L1 with resistance Rs is connected between node 17 and VCC volts.

When PA is turned on, VDD volts are applied to the gate of P2 and to electrode 91 of P2 (which functions like the source for this condition). However, P2 is non-conductive since the gate is shorted to electrode 91 to which are applied the high VDD potential. Furthermore, P2 blocks conduction through P1. Thus, N1 will be turned on and current flows through the inductor but no fault current flows through the P1-P2 conduction path. When NA turns on and the current through N1 decreases, an inductive kick produced at node 17 turns on P1 when V17 exceeds the VT of P1 plus VCC. Current then flows via the conduction path of P1 and the source (electrode 93) to drain (electrode 91) path of P2 into node 23. Thus, P2 functions to block current from node 23 via the conduction path of P1 into node 17 while allowing the flow of current from node 17 via P1 into node 23.

In the circuit of FIG. 6 transistor P1 turns-on when V17 exceeds Vcc plus the threshold voltage (VT) of P1 plus the forward diode drop of D3. In the circuit of FIG. 7, P1 turns on when V17 exceeds Vcc plus VT of P1 plus the VT of N2. In the circuits of FIGS. 8 and 9, P1 turns on when V17 exceeds Vcc plus the VT of P1. Thus the fault current blocking element may be connected either in the source circuit or drain circuit of P1. When placed in the source circuit the blocking element tends to increase the voltage which V17 must reach before P1 turns on. In all instances, the flow of parasitic substrate currents has been inhibited and a fault current path through the main conduction path of P1 is also eliminated.

It should also be understood that many different types of inductive loads may be used in conjunction with circuits embodying the invention.

What is claimed is:

1. A combination comprising:
   first and second power terminals for the application therebetween of an operating potential;
   an insulated-gate power field effect transistor (IGFET), said IGFET having source and drain electrodes defining the ends of a conduction path and a control electrode;
   an inductive load;
   means connecting the source of said IGFET to said first power terminal and the drain of said IGFET to an intermediate node;
   means connecting said inductive load between said intermediate node and said second power terminal;

means for selectively applying a turn-on signal and a turn-off signal to the control electrode of said IGFET;

a selectively enabled feedback network having first and second terminals and providing a direct current (d.c.) conduction path between the two terminals;

direct current (d.c.) means connecting the two terminals of said selectively enabled feedback network between the drain and the control electrode of said IGFET; said selectively enabled feedback network being enabled when said IGFET is being turned-off and in response to a voltage then produced at the drain of said IGFET, which is in excess of a predetermined voltage value, for providing a dc conduction path between the drain and control electrode of said IGFET and for passing a voltage to the control electrode of said IGFET of a polarity to tend to maintain said IGFET conducting, temporarily, in the common source mode for dissipating the energy stored in the inductive load.

2. A combination comprising:

first and second power terminals for the application therebetween of an operating potential;

first, second, and third insulated-gate field effect transistors, (IGFETs), each IGFET having source and drain electrodes defining the ends of a conduction path and a control electrode;

an inductive load;

means connecting the source of said first IGFET to said first power terminal and the drain of said first IGFET to an intermediate node;

means connecting said inductive load between said intermediate node and said second power terminal;

means for selectively applying a turn-on signal to the control electrode of said first IGFET;

means connecting the source of said second IGFET to said intermediate node and its drain to the control electrode of said first IGFET;

means connecting the conduction path of said third IGFET between the control electrode of said first IGFET and said first power terminal, said third IGFET when enabled tending to turn-off said first IGFET; and means for applying a fixed control potential to the control electrode of said second IGFET for inhibiting the turn-on of said second IGFET until the potential at said intermediate node exceeds said fixed control potential.

3. The combination as claimed in claim 2 wherein the fixed control potential is the potential applied to said second power terminal.

4. The combination as claimed in claim 2 wherein the impedance of the conduction path of said second IGFET for a given turn-on condition is less than the impedance of the conduction path of said third IGFET for a like turn-on condition.

5. The combination as claimed in claim 2 wherein the impedance of the conduction path of said third IGFET is such that, when said second IGFET is turned-on and conducting, the voltage developed across the conduction path of said third IGFET is at least equal to the threshold voltage of the first IGFET.

6. The combination as claimed in claim 2 wherein the means connecting the source of the second IGFET to said intermediate node and its drain to the control electrode of said first IGFET includes a unidirectional conducting -means poled to conduct conventional current from said intermediate via the conduction path of said second IGFET to the control electrode of said first IGFET and to block current in the opposite direction.

7. The combination as claimed in claim 6 wherein said second IGFET has a substrate and wherein the substrate of said second IGFET is connected to its source electrode.

8. The combination as claimed in claim 6 wherein said means for selectively applying a turn-on signal to the control electrode of said first IGFET includes a fourth IGFET having its conduction path connected between the control electrode of said first IGFET and a third power terminal for the application thereto of a potential of greater amplitude than the voltage applied to said second power terminal.

9. The combination as claimed in claim 8 wherein said unidirectional conducting means is a fifth IGFET connected to function like a diode.

10. A combination comprising:

first and second power terminals for the application therebetween of an operating potential;

first and second insulated-gate field effect transistors, each IGFET having source and drain electrodes defining the ends of a conduction path and a control electrode;

an inductive load;

means connecting the source of said first IGFET to said first power terminal and the drain of said first IGFET to an intermediate node;

means connecting said inductive load between said intermediate node and said second power terminal;

means for selectively applying a turn-on signal and a turn-off signal to the control electrode of said first IGFET;

direct current (d.c.) means connecting the conduction path of said second IGFET between said intermediate node and the control electrode of said first IGFET for providing a selectively enabled direct current connected feedback path between the drain and the control electrode of said first IGFET; and means for applying a fixed potential to the control electrode of said second IGFET having a value to maintain said second IGFET non-conducting until the voltage at said intermediate node exceeds said fixed potential in a direction to turn on said second IGFET and for then enabling a feedback conduction through the dc connected conduction path of the second IGFET.

11. The combination as claimed in claim 10, wherein said first IGFET is of first conductivity type and said second IGFET is of opposite conductivity type.

12. The combination as claimed in claim 10, wherein said second IGFET includes a substrate region and further including means for applying a voltage to said substrate region to maintain the source-to-substrate region of said second IGFET reverse biased.

13. The combination as claimed in claim 10 wherein said means connecting the conduction path of said second IGFET between said intermediate node and the control electrode of said first IGFET includes a diode poled to conduct current from said intermediate node to said control electrode.

14. The combination as claimed in claim 10 wherein said means connecting the conduction path of said second IGFET between said intermediate node and the control electrode of said first IGFET includes a unidirectional conducting means poled to conduct conventional current from said intermediate node and via the conduction path of said second IGFET to said control electrode of said first IGFET and to block conventional current from said control electrode of said first IGFET via the conduction path of said second IGFET into said intermediate node.

15. The combination as claimed in claim 14 wherein said unidirectional conducting means includes an IGFET connected to function like a diode with its gate connected to its drain.

16. The combination as claimed in claim 15 wherein said unidirectional conducting means is connected between said intermediate node and the source of said second IGFET.

17. The combination as claimed in claim 15 wherein said unidirectional conducting means is connected between the drain of said second IGFET and the control electrode of said first IGFET.

18. The combination as claimed in claim 15 wherein said IGFET with its gate connected to its drain is of the same conductivity type as the second IGFET.

19. The combination as claimed in claim 15 wherein said IGFET with its gate connected to its drain is of the same conductivity type as the first IGFET.

20. The combination as claimed in claim 10, wherein said means for applying a turn-on and a turn-off signal includes a third IGFET having a conduction path and a control electrode, the conduction path of said third IGFET being connected between the control electrode of said first IGFET and said first power terminal, said third IGFET when enabled tending to turn-off said first IGFET.

21. The combination as claimed in claim 20, wherein said fixed potential is equal to the potential at said second power terminal, wherein said second IGFET has a threshold voltage and wherein said second IGFET conducts when the potential at said intermediate node exceeds the potential at said second power terminal plus the threshold voltage of said second IGFET.

22. The combination as claimed in claim 20, wherein in response to said third IGFET being enabled and tending to turn-off said first IGFET, a transient voltage is produced at said intermediate node of a polarity and amplitude to cause conduction through the conduction path of said second IGFET; and wherein the current flowing through the conduction path of said second IGFET also flows through the conduction path of said third IGFET causing the potential at the control electrode of the first IGFET to rise to a level causing said first IGFET to be maintained conducting temporarily for dissipating the energy stored in the inductor.

23. The combination as claimed in claim 22 wherein said first and third IGFETs are of first conductivity type and said second IGFET is of complementary conductivity type.

* * * * *